(12) United States Patent
Oliver et al.

(10) Patent No.: US 7,425,499 B2
(45) Date of Patent: Sep. 16, 2008

(54) METHODS FOR FORMING INTERCONNECTS IN VIAS AND MICROELECTRONIC WORKPIECES INCLUDING SUCH INTERCONNECTS

(75) Inventors: Steven D. Oliver, Boise, ID (US); Kyle K. Kirby, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 513 days.

(21) Appl. No.: 10/925,501

(22) Filed: Aug. 24, 2004

(65) Prior Publication Data
US 2006/0042952 A1 Mar. 2, 2006

(51) Int. Cl.
*H01L 21/44* (2006.01)
(52) U.S. Cl. .................. 438/597; 438/106; 438/120; 438/242; 438/584; 257/E27.001; 257/E27.091
(58) Field of Classification Search .................. 438/597, 438/106–120
See application file for complete search history.

(56) References Cited

U.S. PATENT DOCUMENTS

| | | | |
|---|---|---|---|
| 2,821,959 | A | 2/1958 | Franz |
| 3,006,318 | A | 10/1961 | Monroe, Jr. et al. |
| 3,345,134 | A | 10/1967 | Heymer et al. |
| 3,865,298 | A | 2/1975 | Allen et al. |
| 4,368,106 | A | 1/1983 | Anthony |
| 4,534,100 | A | 8/1985 | Lane |
| 4,608,480 | A | 8/1986 | Bizot et al. |
| 4,614,427 | A | 9/1986 | Koizumi et al. |
| 4,660,063 | A | 4/1987 | Anthony |
| 4,756,765 | A | 7/1988 | Woodroffe |
| 4,768,291 | A | 9/1988 | Palmer |
| 4,906,314 | A | 3/1990 | Farnworth et al. |
| 4,959,705 | A | 9/1990 | Lemnios et al. |

(Continued)

FOREIGN PATENT DOCUMENTS

EP 0127946 12/1984

(Continued)

OTHER PUBLICATIONS

U.S. Appl. No. 10/785,466, Kirby.

(Continued)

*Primary Examiner*—Walter Lindsay, Jr.
*Assistant Examiner*—Abdulfattah Mustapha
(74) *Attorney, Agent, or Firm*—Perkins Coie LLP

(57) ABSTRACT

Methods for forming interconnects in blind vias or other types of holes, and microelectronic workpieces having such interconnects. The blind vias can be formed by first removing the bulk of the material from portions of the back side of the workpiece without thinning the entire workpiece. The bulk removal process, for example, can form a first opening that extends to an intermediate depth within the workpiece, but does not extend to the contact surface of the electrically conductive element. After forming the first opening, a second opening is formed from the intermediate depth in the first opening to the contact surface of the conductive element. The second opening has a second width less than the first width of the first opening. This method further includes filling the blind vias with a conductive material and subsequently thinning the workpiece from the exterior side until the cavity is eliminated.

10 Claims, 12 Drawing Sheets

U.S. PATENT DOCUMENTS

| | | |
|---|---|---|
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,130,783 A | 7/1992 | McLellan |
| 5,145,099 A | 9/1992 | Wood et al. |
| 5,158,911 A | 10/1992 | Quentin |
| 5,233,448 A | 8/1993 | Wu |
| 5,289,631 A | 3/1994 | Koopman et al. |
| 5,292,686 A | 3/1994 | Riley et al. |
| 5,294,568 A | 3/1994 | McNeilly et al. |
| 5,371,397 A | 12/1994 | Maegawa et al. |
| 5,378,312 A | 1/1995 | Gifford et al. |
| 5,402,435 A | 3/1995 | Shiono et al. |
| 5,406,630 A | 4/1995 | Piosenka et al. |
| 5,424,573 A | 6/1995 | Kato et al. |
| 5,435,887 A | 7/1995 | Rothschild et al. |
| 5,447,871 A | 9/1995 | Goldstein |
| 5,464,960 A | 11/1995 | Hall et al. |
| 5,496,755 A | 3/1996 | Bayraktaroglu |
| 5,505,804 A | 4/1996 | Mizuguchi et al. |
| 5,518,956 A | 5/1996 | Liu et al. |
| 5,585,675 A | 12/1996 | Knopf |
| 5,593,913 A | 1/1997 | Aoki |
| 5,605,783 A | 2/1997 | Revelli et al. |
| 5,614,743 A | 3/1997 | Mochizuki |
| 5,627,106 A | 5/1997 | Hsu |
| 5,646,067 A | 7/1997 | Gaul |
| 5,654,221 A | 8/1997 | Cronin et al. |
| 5,672,519 A | 9/1997 | Song et al. |
| 5,673,846 A | 10/1997 | Gruber |
| 5,694,246 A | 12/1997 | Aoyama et al. |
| 5,708,293 A | 1/1998 | Ochi et al. |
| 5,718,791 A | 2/1998 | Spengler |
| 5,723,904 A | 3/1998 | Shiga |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,851,845 A | 12/1998 | Wood et al. |
| 5,857,963 A | 1/1999 | Pelchy et al. |
| 5,861,654 A | 1/1999 | Johnson |
| 5,877,040 A | 3/1999 | Park et al. |
| 5,893,828 A | 4/1999 | Uram |
| 5,897,338 A | 4/1999 | Kaldenberg |
| 5,904,499 A | 5/1999 | Pace |
| 5,914,488 A | 6/1999 | Sone |
| 5,977,535 A | 11/1999 | Rostoker |
| 5,998,292 A | 12/1999 | Black et al. |
| 5,998,862 A | 12/1999 | Yamanaka |
| 6,004,867 A | 12/1999 | Kim et al. |
| 6,008,070 A | 12/1999 | Farnworth |
| 6,080,291 A | 6/2000 | Woodruff et al. |
| 6,103,547 A | 8/2000 | Corisis et al. |
| 6,104,086 A | 8/2000 | Ichikawa et al. |
| 6,107,180 A | 8/2000 | Munroe et al. |
| 6,107,679 A | 8/2000 | Noguchi |
| 6,110,825 A | 8/2000 | Mastromatteo et al. |
| 6,114,240 A | 9/2000 | Akram et al. |
| 6,124,634 A | 9/2000 | Akram et al. |
| 6,130,141 A | 10/2000 | Degani et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,184,465 B1 | 2/2001 | Corisis |
| 6,187,615 B1 | 2/2001 | Kim et al. |
| 6,191,487 B1 | 2/2001 | Rodenbeck et al. |
| 6,222,270 B1 | 4/2001 | Lee |
| 6,228,687 B1 | 5/2001 | Akram et al. |
| 6,229,202 B1 | 5/2001 | Corisis |
| 6,235,552 B1 | 5/2001 | Kwon et al. |
| 6,236,046 B1 | 5/2001 | Watabe et al. |
| 6,246,108 B1 | 6/2001 | Corisis et al. |
| 6,252,300 B1 | 6/2001 | Hsuan et al. |
| 6,259,083 B1 | 7/2001 | Kimura |
| 6,266,197 B1 | 7/2001 | Glenn et al. |
| 6,268,114 B1 | 7/2001 | Wen et al. |
| 6,271,580 B1 | 8/2001 | Corisis |
| 6,274,927 B1 | 8/2001 | Glenn |
| 6,277,757 B1 | 8/2001 | Lin |
| 6,285,064 B1 | 9/2001 | Foster |
| 6,291,894 B1 | 9/2001 | Farnworth et al. |
| 6,294,837 B1 | 9/2001 | Akram et al. |
| 6,326,689 B1 | 12/2001 | Thomas |
| 6,326,697 B1 | 12/2001 | Farnworth |
| 6,341,009 B1 | 1/2002 | O'Connor et al. |
| 6,344,976 B1 | 2/2002 | Schoenfeld et al. |
| 6,351,027 B1 | 2/2002 | Giboney et al. |
| 6,359,328 B1 | 3/2002 | Dubin |
| 6,372,548 B2 | 4/2002 | Bessho et al. |
| 6,391,770 B2 | 5/2002 | Kosaki et al. |
| 6,407,381 B1 | 6/2002 | Glenn et al. |
| 6,411,439 B2 | 6/2002 | Nishikawa |
| 6,437,441 B1 | 8/2002 | Yamamoto |
| 6,441,487 B2 | 8/2002 | Elenius et al. |
| 6,452,270 B1 | 9/2002 | Huang |
| 6,459,039 B1 | 10/2002 | Bezama et al. |
| 6,468,889 B1 | 10/2002 | Iacoponi et al. |
| 6,483,652 B2 | 11/2002 | Nakamura |
| 6,486,083 B1 | 11/2002 | Mizuno et al. |
| 6,486,549 B1 | 11/2002 | Chiang |
| 6,503,780 B1 | 1/2003 | Glenn et al. |
| 6,521,530 B2 * | 2/2003 | Peters et al. ................ 438/667 |
| 6,534,863 B2 | 3/2003 | Walker et al. |
| 6,541,762 B2 | 4/2003 | Knag et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,576,531 B2 | 6/2003 | Peng et al. |
| 6,580,174 B2 | 6/2003 | McCormick et al. |
| 6,593,644 B2 | 7/2003 | Chiu et al. |
| 6,603,183 B1 | 8/2003 | Hoffman |
| 6,614,033 B2 | 9/2003 | Suguro et al. |
| 6,617,623 B2 | 9/2003 | Rhodes |
| 6,620,731 B1 | 9/2003 | Farnworth et al. |
| 6,638,410 B2 | 10/2003 | Chen et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,746,971 B1 | 6/2004 | Ngo et al. |
| 6,759,266 B1 | 7/2004 | Hoffman |
| 6,770,958 B2 | 8/2004 | Wang et al. |

| | | |
|---|---|---|
| 6,774,486 B2 | 8/2004 | Kinsman |
| 6,777,244 B2 | 8/2004 | Pepper et al. |
| 6,778,046 B2 | 8/2004 | Stafford et al. |
| 6,780,749 B2 | 8/2004 | Masumoto et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,809,421 B1 | 10/2004 | Hayasaka et al. |
| 6,813,154 B2 | 11/2004 | Diaz et al. |
| 6,818,464 B2 | 11/2004 | Heschel |
| 6,825,458 B1 | 11/2004 | Moess et al. |
| 6,828,175 B2 | 12/2004 | Wood et al. |
| 6,828,223 B2 | 12/2004 | Chuang |
| 6,828,663 B2 | 12/2004 | Chen et al. |
| 6,828,674 B2 | 12/2004 | Karpman |
| 6,838,377 B2 | 1/2005 | Tonami et al. |
| 6,844,978 B2 | 1/2005 | Harden et al. |
| 6,856,023 B2 | 2/2005 | Muta et al. |
| 6,873,054 B2 | 3/2005 | Miyazawa et al. |
| 6,882,021 B2 | 4/2005 | Boon et al. |
| 6,885,107 B2 | 4/2005 | Kinsman |
| 6,903,012 B2 | 6/2005 | Geefay et al. |
| 6,903,442 B2 | 6/2005 | Wood et al. |
| 6,910,268 B2 | 6/2005 | Miller |
| 6,916,725 B2 | 7/2005 | Yamaguchi |
| 6,934,065 B2 | 8/2005 | Kinsman |
| 6,936,536 B2 | 8/2005 | Sinha |
| 6,943,056 B2 | 9/2005 | Nemoto |
| 6,946,325 B2 | 9/2005 | Yean et al. |
| 6,953,748 B2 | 10/2005 | Yamaguchi |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa |
| 7,033,927 B2 | 4/2006 | Cohen et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Meyers et al. |
| 7,186,650 B1 | 3/2007 | Dakshina-Murthy |
| 7,190,061 B2 | 3/2007 | Lee |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,256,073 B2 | 8/2007 | Noma et al. |
| 7,262,134 B2 | 8/2007 | Kirby et al. |
| 7,265,052 B2 | 9/2007 | Sinha |
| 2002/0005583 A1 | 1/2002 | Harada et al. |
| 2002/0006687 A1 | 1/2002 | Lam |
| 2002/0020898 A1 | 2/2002 | Vu et al. |
| 2002/0057468 A1 | 5/2002 | Segawa et al. |
| 2002/0059722 A1 | 5/2002 | Murakami |
| 2002/0089025 A1 | 7/2002 | Chou |
| 2002/0094607 A1 | 7/2002 | Gebauer et al. |
| 2002/0096729 A1 | 7/2002 | Tu et al. |
| 2002/0113296 A1 | 8/2002 | Cho et al. |
| 2002/0130390 A1 | 9/2002 | Ker et al. |
| 2002/0145676 A1 | 10/2002 | Kuno et al. |
| 2002/0190371 A1 | 12/2002 | Mashino et al. |
| 2003/0014895 A1 | 1/2003 | Lizotte |
| 2003/0062601 A1 | 4/2003 | Harden et al. |
| 2003/0119308 A1 | 6/2003 | Geefay et al. |
| 2003/0216023 A1 | 11/2003 | Wark et al. |
| 2004/0012698 A1 | 1/2004 | Suda et al. |
| 2004/0018712 A1 | 1/2004 | Plas et al. |
| 2004/0023447 A1 | 2/2004 | Hirakata et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0043607 A1 | 3/2004 | Farnworth et al. |
| 2004/0073607 A1 | 4/2004 | Su et al. |
| 2004/0082094 A1 | 4/2004 | Yamamoto |
| 2004/0087441 A1 | 5/2004 | Bock et al. |
| 2004/0137661 A1 | 7/2004 | Murayama |
| 2004/0137701 A1 | 7/2004 | Takao |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0214373 A1 | 10/2004 | Jiang et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0052751 A1 | 3/2005 | Liu et al. |
| 2005/0064707 A1 | 3/2005 | Sinha |
| 2005/0069782 A1 | 3/2005 | Elenius et al. |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0194169 A1 | 9/2005 | Tonomura |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |

| | | |
|---|---|---|
| 2006/0046332 A1 | 3/2006 | Derderian et al. |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0191882 A1 | 8/2006 | Watkins et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0240687 A1 | 10/2006 | Chong et al. |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278980 A1 | 12/2006 | Trezza et al. |
| 2006/0278988 A1 | 12/2006 | Trezza et al. |
| 2006/0281224 A1 | 12/2006 | Edelstein et al. |
| 2006/0281243 A1 | 12/2006 | Trezza |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0138562 A1 | 6/2007 | Trezza |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0281473 A1 | 12/2007 | Clark et al. |
| 2008/0050911 A1 | 2/2008 | Borthakur |

FOREIGN PATENT DOCUMENTS

| | | |
|---|---|---|
| EP | 0 886 323 | 12/1998 |
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 63052432 | 3/1988 |
| JP | 07-263607 A | 10/1995 |
| JP | 2001-077496 A | 3/2001 |
| JP | 2001077496 | 3/2001 |
| JP | 2001298147 | 10/2001 |
| JP | 2005093980 | 4/2005 |
| JP | 2005310817 | 11/2005 |
| KR | 20020022122 | 3/2002 |
| KR | 20020061812 | 7/2002 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |
| WO | WO-2005022965 | 3/2005 |
| WO | WO-2005036940 | 4/2005 |
| WO | WO-2006053036 | 5/2006 |
| WO | WO-2006124597 | 11/2006 |
| WO | WO-2007025812 | 3/2007 |
| WO | WO-2007043718 | 4/2007 |

OTHER PUBLICATIONS

U.S. App. No. 10/845,304, Jiang et al.
U.S. App. No. 10/857,948, Boettiger et al.
U.S. App. No. 10/863,994, Akram et al.
U.S. App. No. 10/864,974, Kirby et al.
U.S. App. No. 10/867,352, Farnworth et al.
U.S. App. No. 10/867,505, Farnworth et al.
U.S. App. No. 10/879,398, Akram et al.
U.S. App. No. 10/879,838, Kirby et al.
U.S. App. No. 10/893,022, Hall et al.
U.S. App. No. 10/894,262, Farnworth et al.
U.S. App. No. 10/901,851, Derderian et al.
U.S. App. No. 10/910,491, Bolken et al.
U.S. App. No. 10/915,180, Street et al.
U.S. App. No. 10/919,604, Farnworth et al.
U.S. App. No. 10/922,177, Oliver et al.
U.S. App. No. 10/922,192, Farnworth.
U.S. App. No. 10/925,406, Oliver.
U.S. App. No. 10/925,502, Watkins et al.
U.S. App. No. 10/927,550, Derderian et al.
U.S. App. No. 10/927,760, Chong et al.
U.S. App. No. 10/928,598, Kirby.
U.S. App. No. 10/932,296, Oliver et al.
U.S. App. No. 11/027,443, Kirby.
U.S. App. No. 11/054,692, Boemler.
U.S. App. No. 11/056,211, Hembree et al.
U.S. App. No. 11/056,484, Boettiger et al.
U.S. App. No. 11/061,034, Boettiger.
U.S. App. No. 11/146,783, Tuttle et al.
U.S. App. No. 11/169,546, Sulfridge.
U.S. App. No. 11/169,838, Sulfridge.
U.S. App. No. 11/177,905, Akram.
U.S. App. No. 11/209,524, Akram.
U.S. App. No. 11/217,169, Hiatt et al.
U.S. App. No. 11/217,877, Oliver et al.
U.S. App. No. 11/218,126, Farnworth et al.
U.S. App. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141:145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Sceince B.V.

Tapes II International Tape and Fabrication Company, Electronics and Electrical Tapes, 2 pages, 2003, <http://www.tapes2.com/electronics.html>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003. 15, 83-91.

Yoshida, J. "TransChip rolls out a single-chip CMOS imager," 3 pages, EE Times, Jul. 18, 2003.

International Search Report for PCT/US2005/028149; Dec. 21, 2005; 5 pages.

Written Opinion for PCT/US2005/028149; Dec. 21, 2005; 8 pages.

U.S. Appl. No. 11/513,661, filed Aug. 30, 2006, Pratt.

U.S. Appl. No. 11/514,568, filed Aug. 31, 2006, Tuttle.

U.S. Appl. No. 11/774,419, filed Jul. 06, 2007, Hutto.

U.S. Appl. No. 11/848,836, filed Aug. 31, 2007, Jeung et al.

U.S. Appl. No. 11/863,579, filed Sep. 28, 2007, Kheng.

U.S. Appl. No. 11/951,751, filed Dec. 06, 2007, Sulfridge.

U.S. Appl. No. 11/966,824, filed Dec. 28, 2007, Pratt et al.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007 - Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, jan. 25, 2000, <http://www.smta.org/files/PanPac00-ChouBill.pdf>.

Hirafune, S. et al., "Packaging Technology for Imager Using Through-hole Interconnection in Si Substrate," Proceeding of HDP'04, IEEE, pp. 303-306, Jul. 2004.

Lee, Rex A. et al., "laser Created Silicon Vias for Stacking Dies in MCMs," IEEE/CHMT IEMT Symposium, 1999, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007 - Jun. 1, 2007, pp. 853-857.

Takahashi, K. et al., "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007 - Jun. 1, 2007, pp. 643-647.

Trigas, C., "System-In-Package or System-On-Chip?," EE Times, Sep. 19, 2003, <http://www.eetimes.com/story/OEG20030919S0049>.

XSiL, xise200 for vias and micro-matchining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

\* cited by examiner

US 7,425,499 B2

METHODS FOR FORMING INTERCONNECTS IN VIAS AND MICROELECTRONIC WORKPIECES INCLUDING SUCH INTERCONNECTS

TECHNICAL FIELD

The present invention relates to forming interconnects in deep vias to electrically couple conductive elements at different elevations of a microelectronic workpiece.

BACKGROUND

Microelectronic devices, micromechanical devices, and other devices with microfeatures are typically formed by constructing several layers of components on a workpiece. In the case of microelectronic devices, a plurality of dies are fabricated on a single workpiece, and each die generally includes an integrated circuit and a plurality of bond-pads coupled to the integrated circuit. The dies are separated from each other and packaged to form individual microelectronic devices that can be attached to modules or installed in other products.

One aspect of fabricating and packaging such dies is forming interconnects that electrically couple conductive components located in different layers. In some applications, it may be desirable to form interconnects that extend completely through the dies or through a significant portion of the dies. Such interconnects electrically couple bond-pads or other conductive elements proximate to one side of the dies to conductive elements proximate to the other side of the dies. Through-wafer interconnects, for example, are constructed by forming deep vias from the backside of the wafer to bond-pads on the front side of the wafer. The vias are often blind vias in that they are closed at one end. The blind vias are then filled with a conductive material. After further processing the wafer, it is eventually thinned to reduce the thickness of the final dies. Solder balls or other external electrical contacts are subsequently attached to the through-wafer interconnects at the backside of the wafer.

One concern of forming through-wafer interconnects in blind vias is that it is difficult to form such deep, narrow holes in the wafer. The blind vias are often formed at a stage when the workpieces are approximately 750-1,500 μm thick. The blind vias can be formed by etching the holes through a significant portion of the workpiece, but etching deep, narrow holes requires a significant amount of time. Moreover, the depth of the holes is difficult to control and the etchant may damage features on the backside of the workpiece.

The blind vias are also formed by laser drilling holes into the workpiece. Laser drilling deep, narrow holes through the workpiece is not practical in several applications. First, it is difficult to control the depth of the holes. More specifically, the bond-pad may not be exposed if the hole is not deep enough, or the bond-pad may be ablated if the hole is drilled too deep. Second, laser drilling deep into the workpiece produces large heat-affected zones that may affect neighboring structures within the wafer and slag that is difficult to clean. Therefore, etching or laser drilling such deep, high aspect ratio holes in a workpiece at this stage of the fabrication process may not be practical in many applications.

Another concern of forming through-wafer interconnects is that it is difficult to fill deep, narrow blind vias. Vapor deposition processes, for example, may not uniformly cover the sidewalls in such holes, and this may cause the openings of the holes to be "pinched-off" before the holes are filled with the conductive material. The resulting interconnects may have voids. Plating processes may also produce voids because the seed layers have similar nonuniformities that cause the plating rate to be higher at the openings than deep within the vias.

Furthermore, it is not feasible to further thin the workpieces before forming the interconnects because the workpiece may not have sufficient structural integrity to withstand the automatic handling equipment used in subsequent processes. For example, very thin wafers easily flex and will partially conform to vacuum chunks used in handling the wafer. Such thin wafers are also very delicate and are easily damaged or broken. Therefore, there is a need to more effectively form blind vias and other deep holes in microfeature workpieces.

DETAILED DESCRIPTION

A. Overview

Figure 1A:
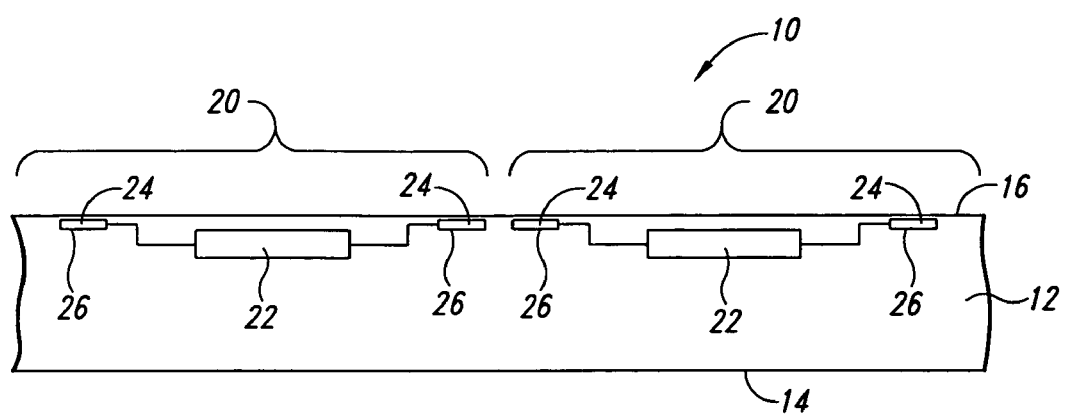
FIGS. 1A-1E are cross-sectional views illustrating a portion of a workpiece at stages of a method for forming interconnects in accordance with an embodiment of the invention.

The following disclosure describes several embodiments of methods for forming interconnects in blind vias or other types of holes, and microelectronic workpieces having such interconnects. The blind vias extend to contact surfaces of conductive elements, and the interconnects engage the conductive elements to electrically couple the conductive elements with other features at a different level of the workpiece. As explained below, many embodiments of the invention efficiently form the blind vias and also fill the blind vias with a conductive material in a manner that mitigates voids.

The blind vias can be formed by first removing a significant thickness of material from selected regions of the back side of the workpiece using a fast bulk removal process without thinning the entire workpiece. The bulk removal process, for example, can form a first opening that extends to an intermediate depth within the workpiece but does not extend to the contact surface of the electrically conductive element. The first opening can be formed with an abrasive disk, a laser, or an isotropic etch that quickly removes the material to the intermediate level. The first opening can be a trench or other depression having a first width larger than the desired width for the interconnects. After forming the first opening, a second opening is formed from the intermediate level in the first opening to the contact surface of the conductive element. The second opening has a second width less than the first width of the first opening. The second opening can be formed using a more precise laser or etching process. This two-step process is expected to reduce the time required to form the blind vias for the interconnects, provide better control for end-pointing the depth of the vias, and reduce undesirable collateral damage to the workpiece (e.g., heat-affected zones, etc.).

One embodiment of a method for forming an interconnect comprises forming a plurality of cavities in the workpiece and constructing blind vias from the cavities to the contact surfaces of the conductive elements. The cavities have a first width at a first exterior side of the workpiece and a depth extending to an intermediate level in the workpiece. The blind vias extend from the intermediate level in the cavities to the contact surfaces of the conductive elements. The blind vias have a second width less than the first width of the cavities. Several embodiments of this method further include filling the blind vias with a conductive material and subsequently thinning the workpiece from the exterior side until the cavities are eliminated. The workpiece can be thinned by removing material from the exterior surface of the workpiece to form a back surface at least at the intermediate depth. For example, the backside of the workpiece can be ground and/or planarized until the back surface is formed between the contact surfaces of the conductive elements and the intermediate level of the cavities.

Another embodiment of a method for forming an interconnect includes removing a selected region of the workpiece to form a large area depression in the workpiece having a first width and an end-surface. The end-surface is spaced apart from the contact surface of the conductive element. This embodiment further includes forming a blind via extending from the end-surface of the depression to the contact surface of the conductive element. The blind via has a second width less than the first width of the depression. Additional embodiments of this method further include depositing a conductive material into the blind via until the blind via is filled with the conductive material, and terminating the deposition of the conductive material into the blind via before the depression is filled with the conductive material.

Another aspect of the invention is directed toward microelectronic workpieces having suitable structures for forming interconnects engaged with a contact surface of a conductive element. In one embodiment, a microelectronic workpiece includes a substrate having a plurality of microelectronic dies at an active side of the substrate. The dies include conductive elements having blind contact surfaces (e.g., contact surfaces that are not exposed on an exterior surface of the workpiece). The workpiece further includes a cavity in a backside of the substrate and a via extending further into the substrate from the cavity. The cavity has a first width at the backside and a first depth extending from the backside to an intermediate level between the active side and the backside. The via is aligned with the cavity and extends from the intermediate level in the cavity to a contact surface of one of the conductive elements. The via has a second width less than the first width of the cavity. The workpiece further includes conductive material in the via. The conductive material fills the via, but not the cavity, such that a void remains in the cavity after filling the via. The void in the cavity, more specifically, can be an unoccupied depression that is eliminated after the wafer has been thinned.

Another embodiment of a microelectronic workpiece includes a substrate having a plurality of dies at an active side of the substrate. The workpiece further includes a first opening extending from a backside of the substrate to an intermediate level within the substrate. The first opening is located in a sacrificial portion of the substrate that is subsequently removed when the workpiece is thinned. The workpiece can further include a second opening aligned with the first opening. The second opening extends to a contact surface at one of the conductive elements. The second opening is at least partially filled with a conductive material.

Specific details of several embodiments of the invention are described below with reference to through-wafer interconnects extending from a bond-pad proximate to the active side of a workpiece, but the methods and workpieces described below can be used for other types of interconnects within microelectronic workpieces. Several details describing well-known structures or processes often associated with fabricating microelectronic devices are not set forth in the following description for purposes of clarity. Also, several other embodiments of the invention can have different configurations, components or procedures than those described in this section. A person of ordinary skill in the art, therefore, will accordingly understand that the invention may have other embodiments with additional elements, or the invention may have other embodiments without several of the elements shown and described below with reference to FIGS. 1A-7C.

B. Forming Interconnects in Blind Vias

FIGS. 1A-1E illustrate forming blind vias and interconnects in a workpiece 10 in accordance with an embodiment of the invention. FIG. 1A illustrates the workpiece 10 at an initial stage before the blind vias and interconnects have been formed. The workpiece 10 can include a substrate 12 having a first side 14 and a second side 16. The workpiece 10 can also include a plurality of microelectronic dies 20 at the second side 16 of the substrate 12. Each microelectronic die 20 can include an integrated circuit 22 and a plurality of conductive elements 24 operatively coupled to the integrated circuit 22. The conductive elements 24 shown in FIG. 1A are internal features, such as bond-pads that have not been exposed at the second side 16, that include contact surfaces 26. In the embodiment shown in FIG. 1A, the contact surfaces 26 are blind or embedded surfaces in that they are not at the exterior of the workpiece 10.

Figure 1B:
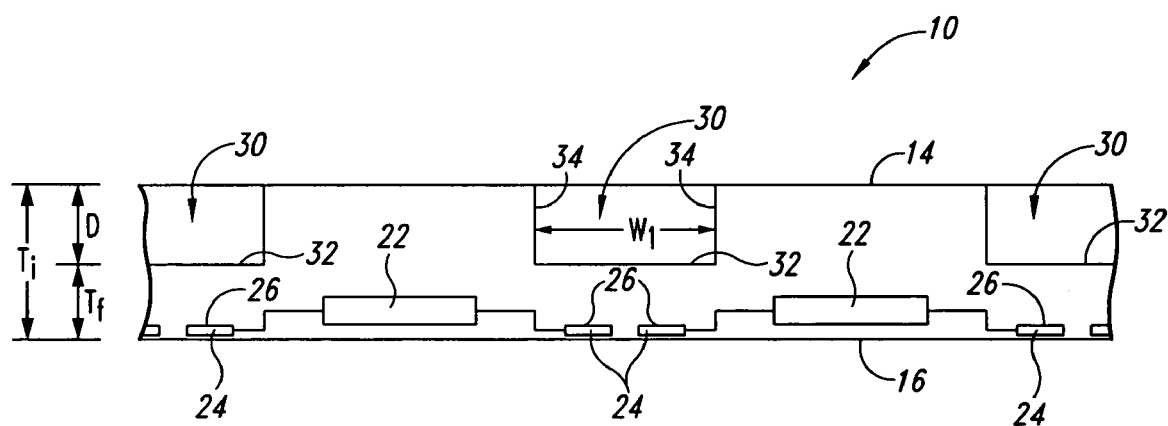

FIG. 1B illustrates the workpiece 10 at a bulk removal stage of the method in which the workpiece 10 has been inverted such that the first side 14 faces upward and the second side 16 faces downward. At this stage, one or more first openings 30 are formed in the workpiece 10. The first openings 30 can be cavities or depressions having a first width $W_1$ at the first side 14 of the substrate 12 and a depth D at an intermediate level within the workpiece. More specifically, the first openings 30 can have one or more sidewalls 34 separated by the first width $W_1$ and an end-surface 32 at the depth D. The depth D of the first openings 30 is selected to reduce the thickness of the workpiece 10 from an initial thickness $T_i$ to a thickness at least proximate to a final desired thickness $T_f$ in regions of the workpiece aligned with the conductive elements 24. The end-surface 32 of the first openings 30 is accordingly located at a level within the workpiece 10 at least proximate to the desired final thickness $T_f$ after thinning the workpiece. As a result, the first openings 30 are located in a sacrificial portion of the workpiece 10 that is removed when the workpiece is thinned.

The first openings 30 can be a pattern of trenches or holes. The first openings 30, for example, can be formed using wet etches, dry etches, lasers, abrasive disks, abrasive-tipped routers, and/or Microelectrode discharge units. A laser can quickly form the first openings 30 using the "trepan" method in which the laser beam makes multiple passes across the wafer in straight, square or circular patterns. Abrasive disks are well suited for forming trench-type first openings 30 by cutting a pattern of trenches into the first side. One aspect of forming the first openings 30 using lasers, abrasive articles, and aggressive etches is that the large area depressions are quickly formed in a sacrificial portion of the workpiece 10 without thinning the entire workpiece.

Figure 1C:
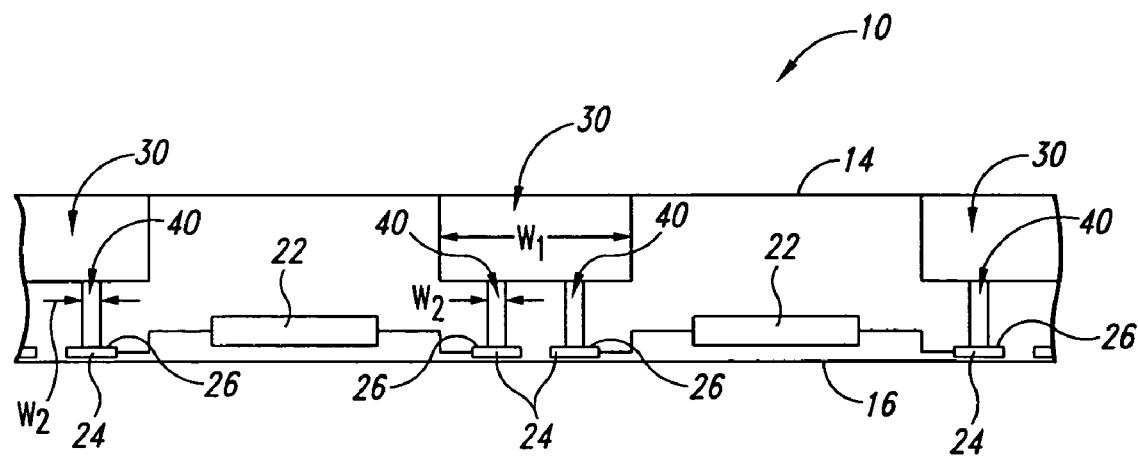

FIG. 1C illustrates the workpiece 10 at a fine removal stage in which a plurality of second openings 40 are formed in the workpiece 10. The second openings 40 extend from the intermediate depth at the end-surfaces 32 of the first openings 30 to the contact surfaces 26 of the conductive elements 24. The first openings 30 and the second openings 40 have substantially different widths in the embodiment shown in FIG. 1C. For example, the second openings 40 have a second width $W_2$ at the intermediate level of the end-surfaces 32 that is less than the first width $W_1$ of the first openings 30. The second width $W_2$ is generally approximately equal to the desired width of the interconnects, and the depth of the second openings 40 is at least as long as the desired length of the interconnects. The second openings 40 accordingly provide blind vias into which a conductive material is deposited to form the interconnects. As explained in more detail below with reference to FIGS. 2A-4, the second openings 40 can be formed using laser drilling techniques, etching processes, or other suitable techniques for forming precise holes in the workpiece.

Figure 1D:
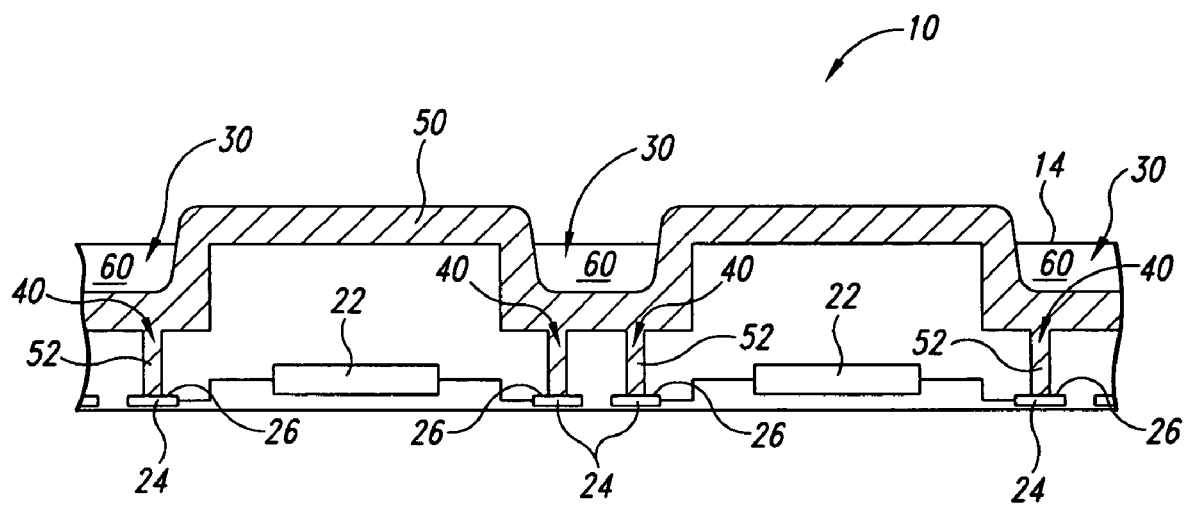

FIG. 1D illustrates a filling stage in which a conductive material 50 is deposited onto the workpiece 10 to fill the second openings 40. The portions of the conductive material 50 in the second openings 40 define interconnects 52. The conductive material 50 deposited onto the workpiece 10 fills at least a portion of the second openings 40; the conductive material 50 preferably completely fills the second openings 40. The first openings 30, however, need not be completely filled by the conductive material 50. As such, an unoccupied void 60 can remain in the first openings 30 after filling the second openings 40 with the conductive material 50. In the embodiment shown in FIG. 1D, the conductive material 50 can be deposited using vapor deposition processes, plating processes, and/or other suitable processes for filling the second openings 40. Several specific embodiments of filling the second openings 40 with the conductive material 50 are described below with reference to FIGS. 5A-7C.

Figure 1E:
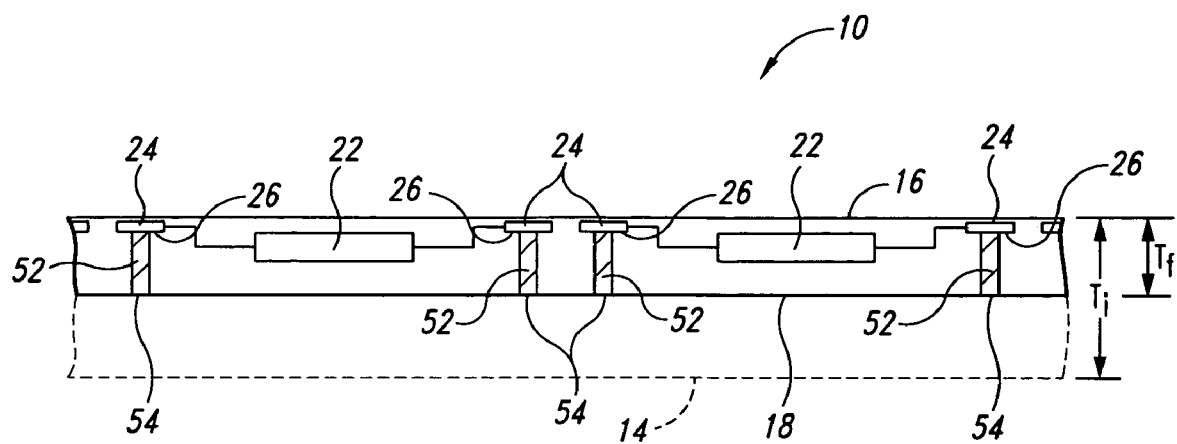

FIG. 1E illustrates a thinning stage in which the workpiece 10 is thinned to the desired final thickness $T_f$. The workpiece 10 can be thinned by dry grinding, wet grinding, and/or planarizing (e.g., CMP). In the illustrated embodiment, the workpiece 10 has been thinned from the original first side 14 to a back surface 18. The back surface 18 is formed at a level between the contact surfaces 26 and the end-surfaces 32 (FIGS. 1B and 1C). In several applications, the initial thickness $T_i$ of the workpiece is approximately 750 μm, and the final thickness $T_f$ is approximately 150-350 μm. The thinning stage accordingly eliminates the first openings 30 (FIGS. 1B-1D) and forms the back surface 18 at a level within the workpiece 10 such that the interconnects 52 are electrically isolated from each other.

Several embodiments of forming the interconnects 52 illustrated in FIGS. 1A-1E are expected to provide several advantages compared to laser drilling or etching conventional blind vias. For example, the second openings 40 can be formed faster because the first openings 30 are formed using fast bulk removal processes. The slower, more precise processes for forming the second openings 40 accordingly do not need to remove as much material from the workpiece 10 compared to conventional processes. As a result, several embodiments of the method illustrated in FIGS. 1A-1E should increase the throughput of forming deep interconnects.

Another advantage of several of the embodiments of the method illustrated in FIGS. 1A-1E is that the narrow second openings 40 have a much lower aspect ratio compared to conventional holes having the same width $W_2$ from the initial thickness $T_i$ to the contact surfaces 26. This provides a significant benefit because conventional high aspect ratio holes extending completely through the initial thickness $T_i$ of the workpiece 10 are difficult to fill with conductive material without forming voids or other discontinuities in the interconnects. The lower aspect ratio second openings 40 are much easier to fill with the conductive material, and many more deposition techniques can be used to fill the second openings 40.

Still additional advantages of several of the embodiments of the method illustrated in FIGS. 1A-1E is that the width and depth of the second openings 40 can be accurately controlled and heat-affected zones can be mitigated. For example, compared to laser drilling through the entire initial thickness $T_i$ of the workpiece 10, the second openings 40 can be formed through the much thinner portion of the workpiece between the contact surfaces 26 and the end-surfaces 32. This requires less energy and results in smaller heat-affected zones, less slag in the holes, and better end-pointing to avoid over-ablation or under-ablation.

The embodiments of the individual stages illustrated and described with reference to FIGS. 1A-1E can be executed by several different sub-processes. FIGS. 2A-4 illustrate several embodiments of the fine removal stage for forming the second openings 40, and FIGS. 5A-7C illustrate several embodiments of the filling stage for filling the second openings 40 and the thinning stage for thinning the workpiece. The more detailed embodiments of the stages shown in FIGS. 2A-7C are provided in addition to the general embodiments of these stages described above with reference to FIGS. 1A-1E. As such, the embodiments of the stages described in FIGS. 1A-1E are not limited to the embodiments of the stages described with reference to FIGS. 2A-7C.

C. Embodiments of Methods for Forming the Second Openings

Figure 2A:
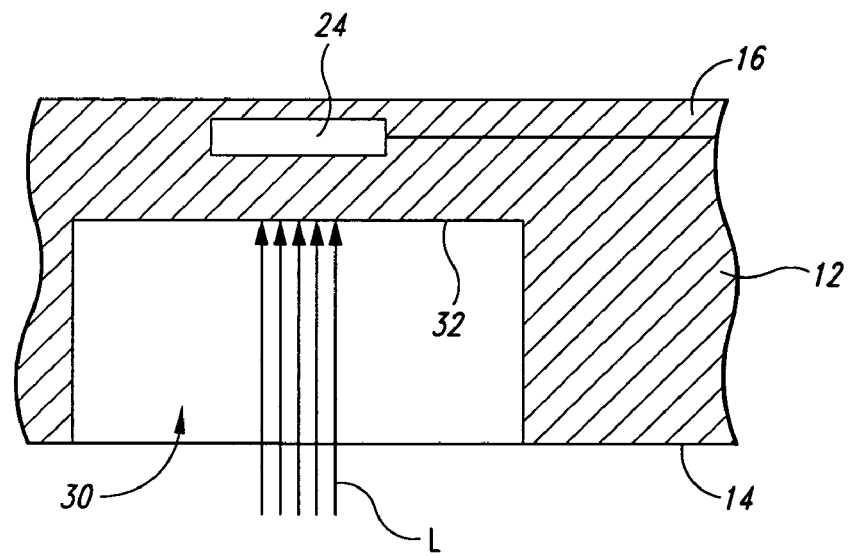
FIGS. 2A-2B are cross-sectional views illustrating a portion of a workpiece in more detail at stages of a method for forming interconnects in accordance with an embodiment of the invention.
Figure 2B:
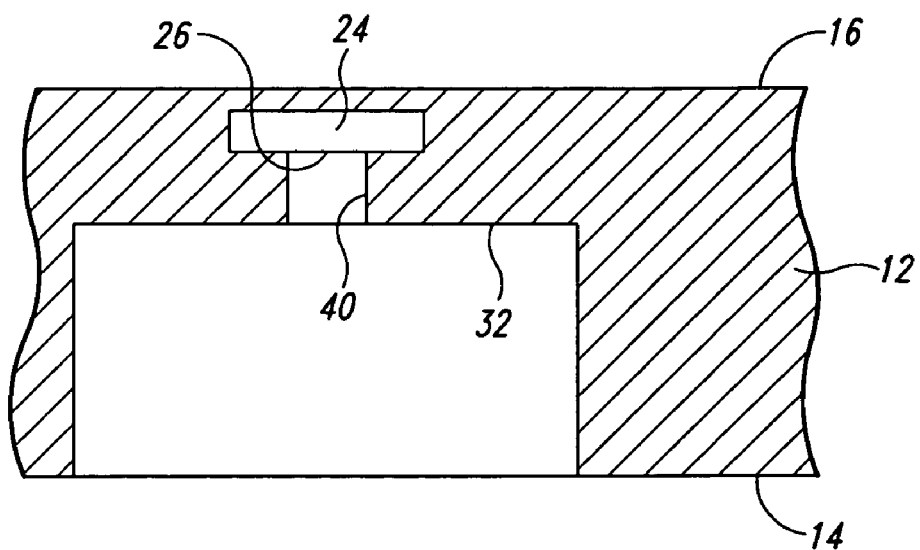

FIGS. 2A and 2B are schematic cross-sectional views illustrating one embodiment of the fine removal stage for forming the second openings 40 (FIG. 1C). Like reference numbers refer to like components in FIGS. 1A-2B. Referring to FIG. 2A, this stage includes aligning a laser beam L with a conductive element 24 and directing the laser beam L through the first hole 30. As shown in FIG. 2B, the laser beam L ablates the substrate starting at the end-surface 32 of the first opening 30 and finishing at the contact surface 26 of the conductive element 24. This process is then repeated at each conductive element 24 to form a plurality of the openings 40. Because the distance between the contact surface 26 and the end-surface 32 is significantly less than the distance between the contact surface 26 and the first side 14, the second opening 40 can be formed with much more precision than conventional methods. As explained above with reference to FIGS. 1D and 1E, the second openings 40 can be filled with a conductive material and the workpiece 10 can be thinned to form interconnects in the second openings.

Figure 3A:
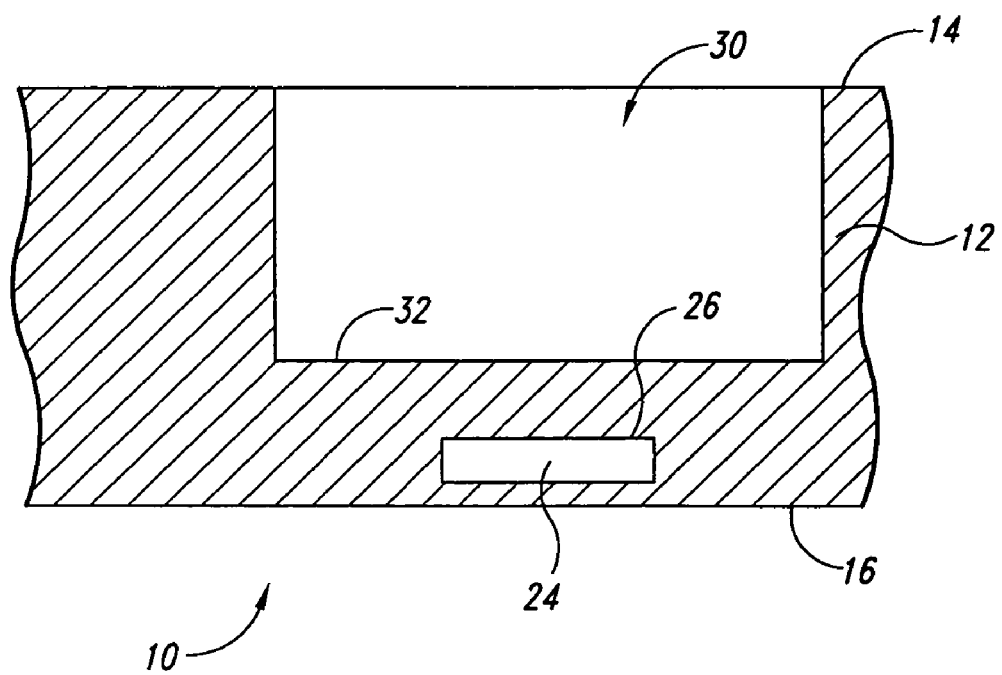
FIGS. 3A-3D are cross-sectional views illustrating a portion of a workpiece at stages of a method for forming interconnects in accordance with another embodiment of the invention.
Figure 3B:
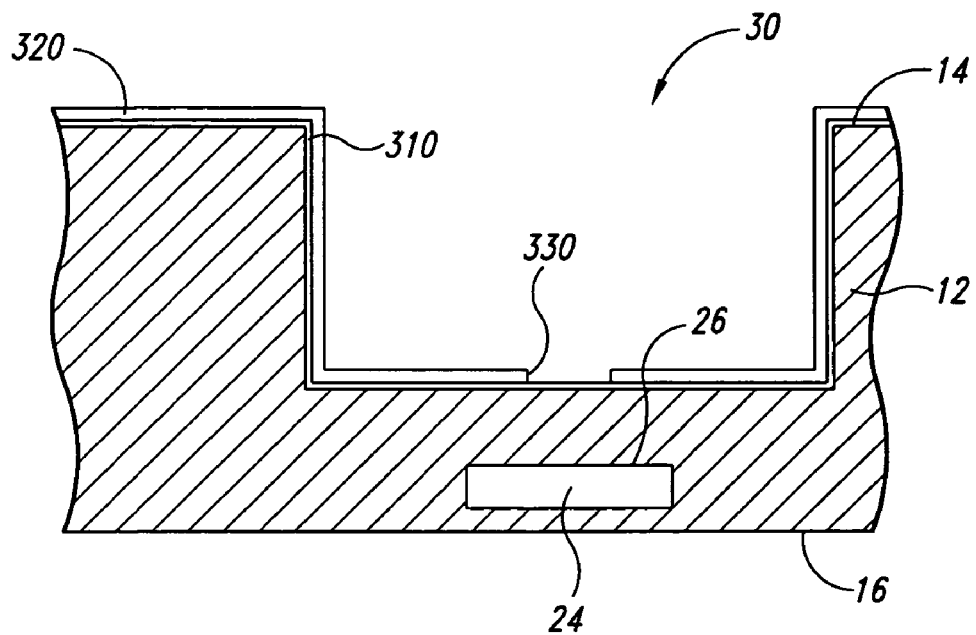

FIGS. 3A-3D illustrate another embodiment of the fine removal stage for forming the second openings 40. FIG. 3A illustrates a portion of the workpiece 10 as described above with reference to FIG. 1B, and thus like reference numbers refer to like components in FIGS. 1A-3D. Referring to FIG. 3B, this stage includes depositing a seed layer 310 onto the workpiece 10 using a vapor deposition process and depositing a layer of electrophoretic resist 320 onto the seed layer 310 using known plating techniques or other techniques. This embodiment also includes patterning the resist layer 320 to form openings 330 aligned with corresponding conductive elements 24 (only one opening 330 and one conductive element are shown).

Figure 3C:
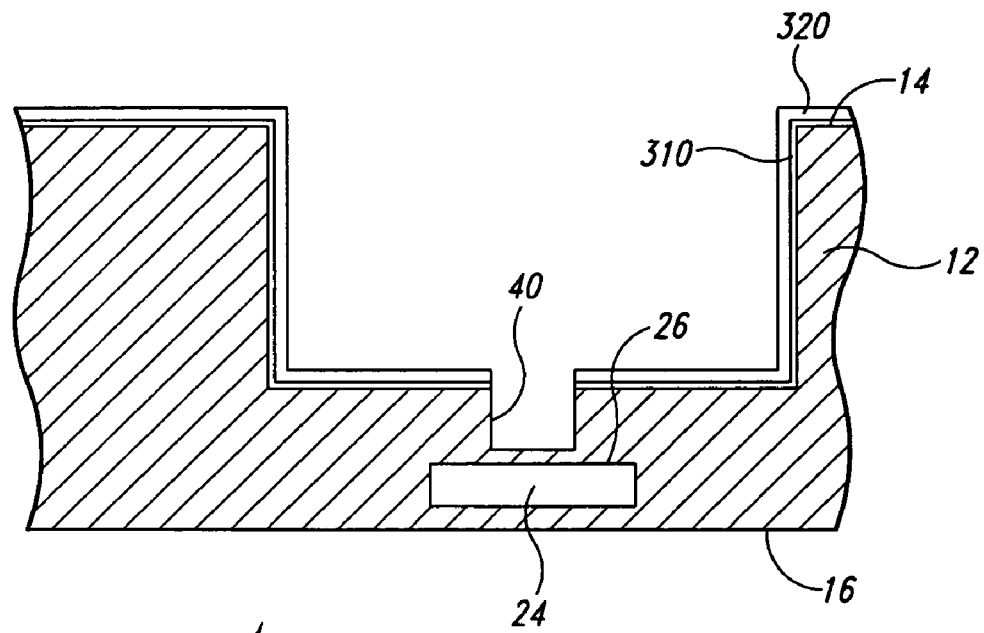
Figure 3D:
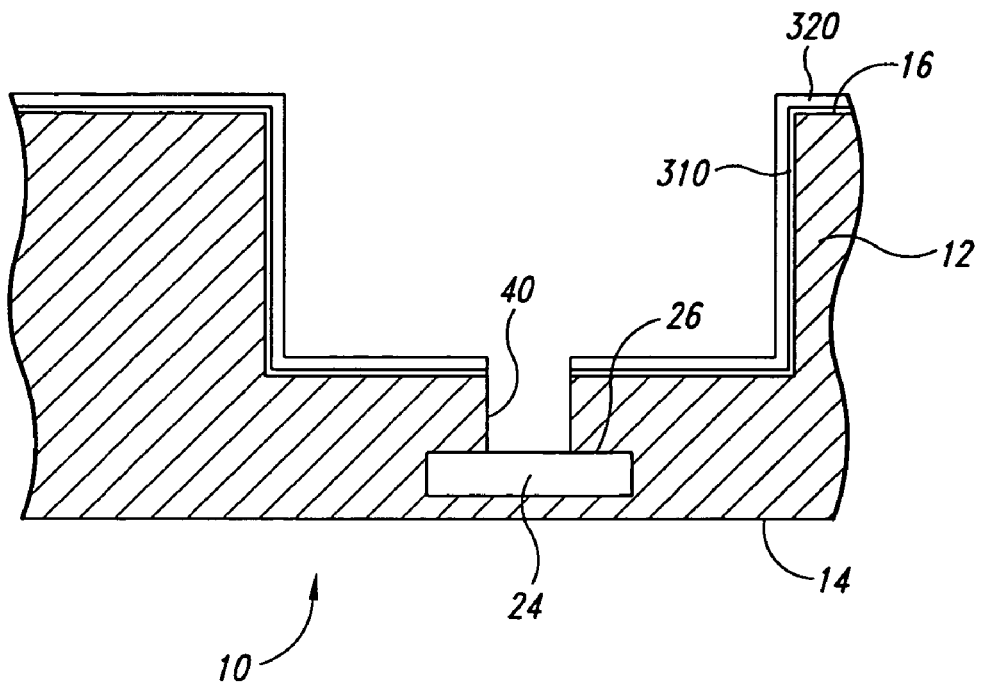

This stage continues with a two-phase etching process to form the second opening 40. Referring to FIG. 3C, the first phase of the etching process selectively removes the silicon of the substrate to an oxide formation (not shown) on the contact surface 26. Referring to FIG. 3D, the second phase of the etching process selectively removes the oxide from the contact surface 26. The two-phase etching process illustrated in FIGS. 3C and 3D is advantageous because the oxide formation on the contact surface 26 provides an etch stop for the first phase of the process, and the metal contact surface 26 provides an etch stop for the second phase of the process. As such, this embodiment of the fine removal stage can precisely end-point the second opening 40 at the contact surface 26.

Figure 4:
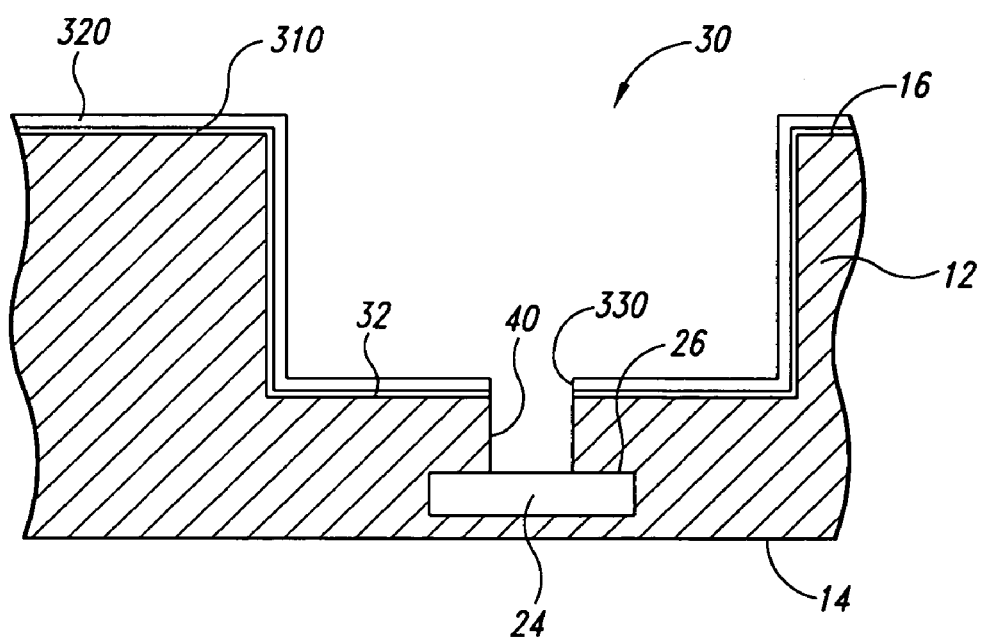
FIG. 4 is a cross-sectional view of a portion of a workpiece illustrating a stage of a method for forming interconnects in accordance with yet another embodiment of the invention.

FIG. 4 illustrates another embodiment of the fine removal stage for forming the second opening 40. In this embodiment, the electrophoretic resist layer 320 is deposited and patterned to form the opening 330 as described above with reference to FIG. 3B. The second opening 40, however, is formed using a single-phase etching process that etches through the seed layer 310 and the workpiece 10 from the end-surface 32 to the contact surface 26.

D. Embodiments of Methods for Filling the Second Openings

After forming the second openings 40 to expose the contact surfaces 26 of the conductive elements 24, the second openings 40 are filled with a conductive material and the workpiece is thinned to construct the interconnects as described above with reference to FIGS. 1D and 1E. FIGS. 5A-7C illustrate several embodiments of filling the second openings 40 and thinning the workpiece 10.

Figure 5A:
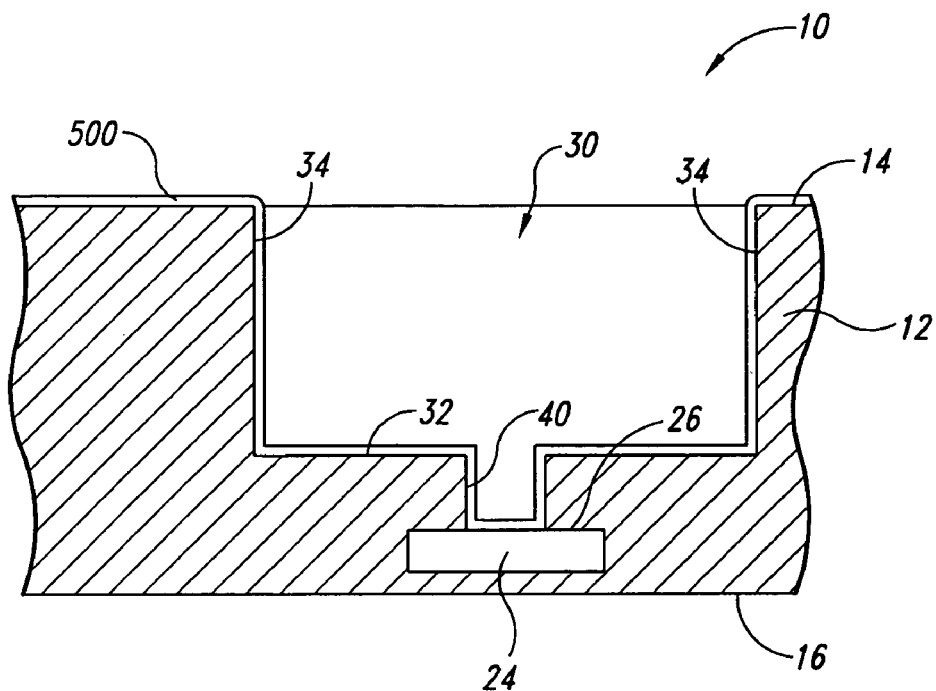
FIGS. 5A-5E are cross-sectional views of a portion of a workpiece illustrating stages of a method for forming interconnects in accordance with another embodiment of the invention.
Figure 5B:
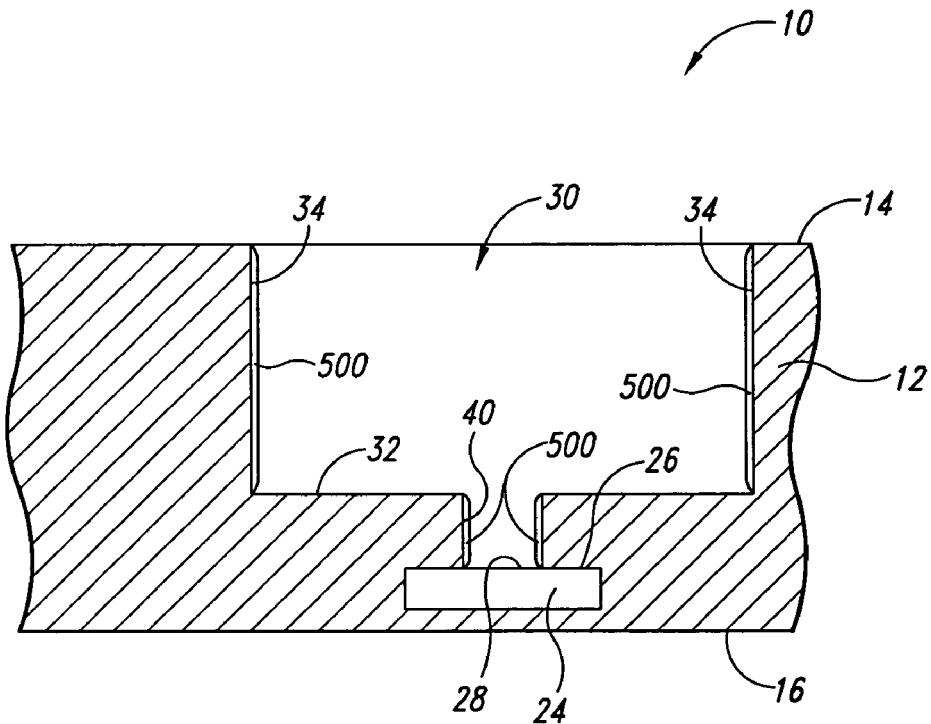

FIGS. 5A-5E illustrate an embodiment of filling the second openings 40 using a plating process. Referring to FIG. 5A, this embodiment of the filling stage includes depositing an oxide layer 500 on the workpiece 10 to form a dielectric liner in the second opening 40. As shown in FIG. 5B, the method continues by spacer etching the workpiece 10 to selectively etch the oxide 500 from surfaces that are transverse to the direction of the etchant. For example, when the back side 14 of the workpiece 10 is perpendicular to the direction of the etchant, the spacer etch removes the oxide layer 500 from the back side 14, the end-surface 32, and an interface region 28 of the contact surface 26. The portions of the oxide layer 500 on the sidewall of the second opening 40 and the sidewall 34 of the first opening 30 remain on the workpiece 10. As such, the sidewall of the second opening 40 is lined with a dielectric layer to electrically insulate the substrate 12.

Figure 5C:
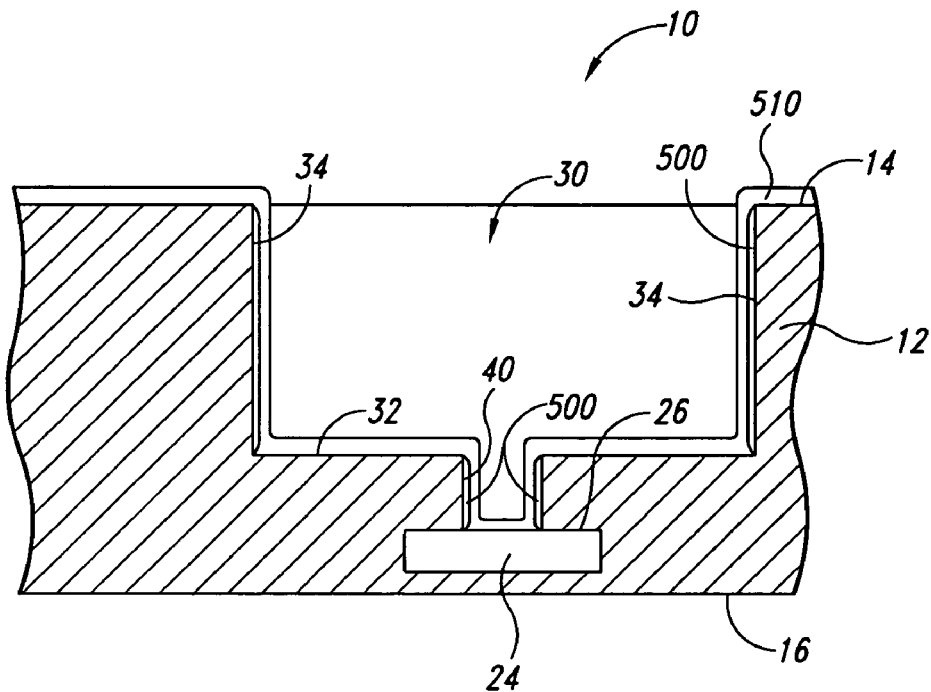
Figure 5D:
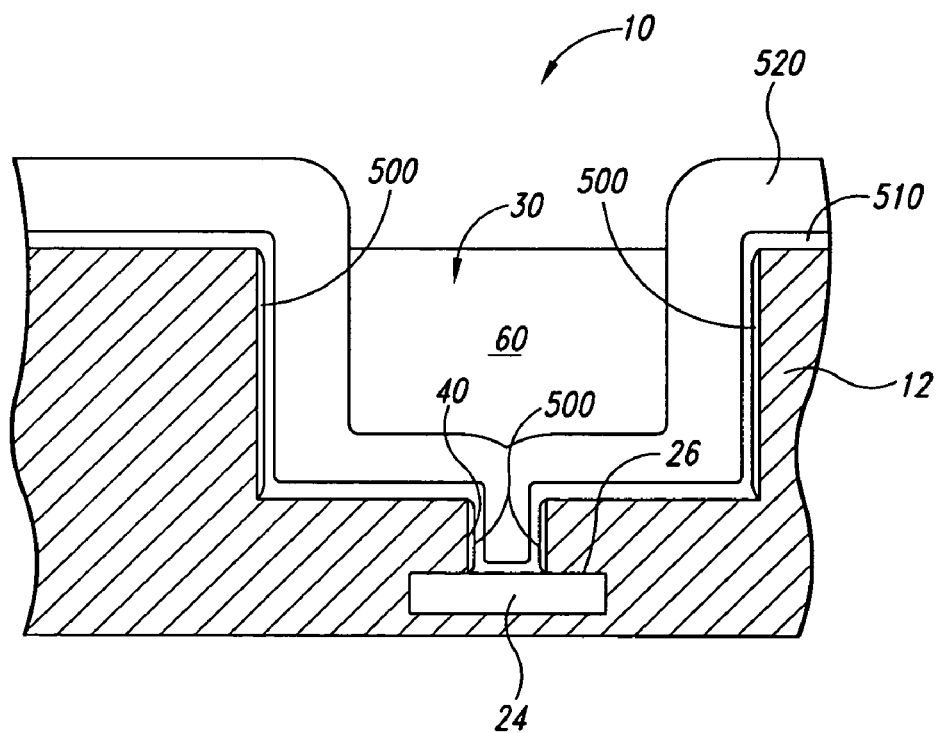

FIGS. 5C and 5D illustrate one embodiment for plating conductive material into the second opening 40. Referring to FIG. 5C, this embodiment of the filling stage includes depositing a seed layer 510 onto the workpiece 10. The seed layer 510 can be deposited using vapor deposition techniques, such as chemical vapor deposition, physical vapor deposition and/or atomic layer deposition. Suitable materials for the seed layer 510 include copper, tungsten, cobalt, aluminum and other materials used in the semiconductor industry. In some applications (e.g., plating copper), a barrier layer (e.g., tantalum) is generally deposited onto the workpiece before depositing the seed layer 510. Referring to FIG. 5D, this stage can continue by applying an electrical potential to the seed layer 510 at one polarity and to an electrode in a plating bath (not shown) at an opposite polarity to plate a conductive layer 520 onto the seed layer 510. In other embodiments, electroless plating processes can be used to plate the conductive layer 520 onto the seed layer 510. The conductive layer 520 can fill the second openings 40 without voids because the aspect ratio of the second openings 40 can be low enough to avoid pinch-off. The conductive layer 520 typically does not completely fill the first openings 30 such that the first openings 30 have the unoccupied void 60 after filling the second openings 40. The conductive layer 520 can include copper, gold, nickel or other suitable materials or alloys of materials having the desired conductivity.

Figure 5E:
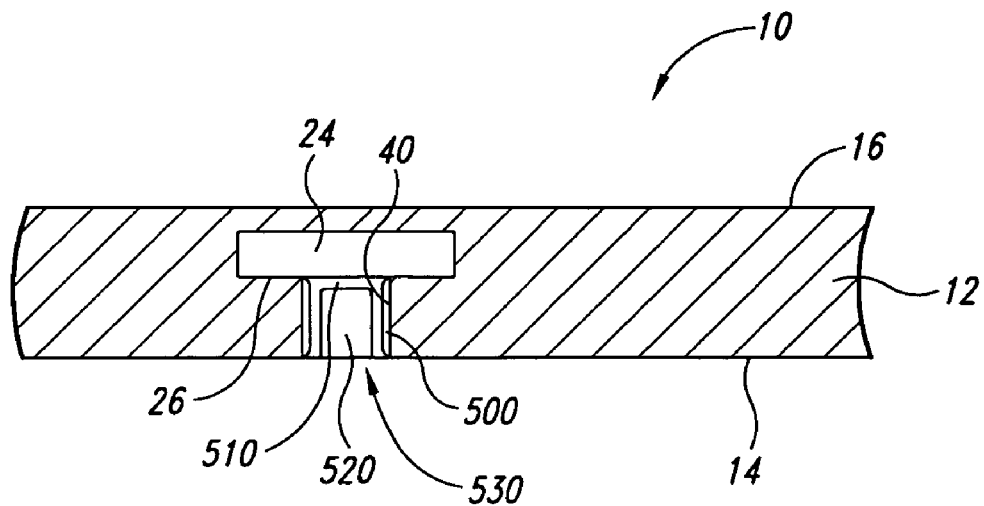

FIG. 5E illustrates an embodiment of the thinning stage after the workpiece 10 has been thinned to electrically isolate the conductive material 520 in the second opening 40. An interconnect 530 formed by this embodiment is defined by the portions of the seed layer 510 and conductive layer 520 remaining in the second opening 40. The portion of the oxide layer 500 remaining in the second opening 40 electrically isolates the interconnect 530 from the substrate 12. The workpiece 10 can be thinned in a manner described above with reference to FIG. 1E.

Figure 6A:
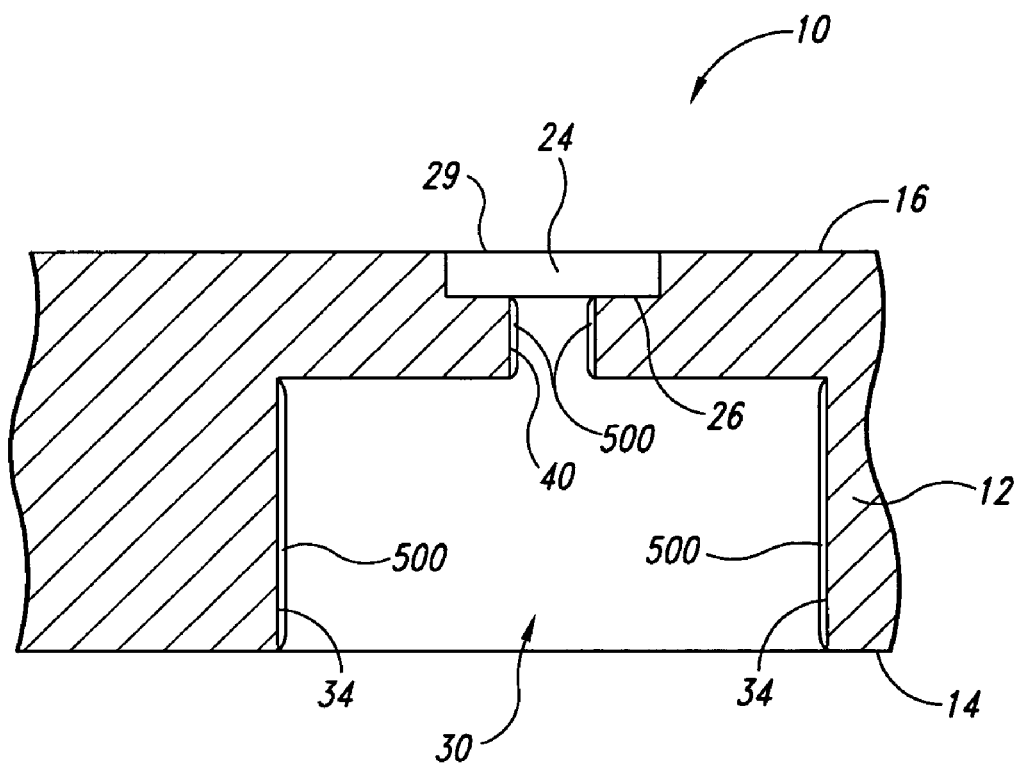
FIGS. 6A-6C are cross-sectional views of a portion of a workpiece illustrating stages of a method for forming interconnects in accordance with still another embodiment of the invention.
Figure 6B:
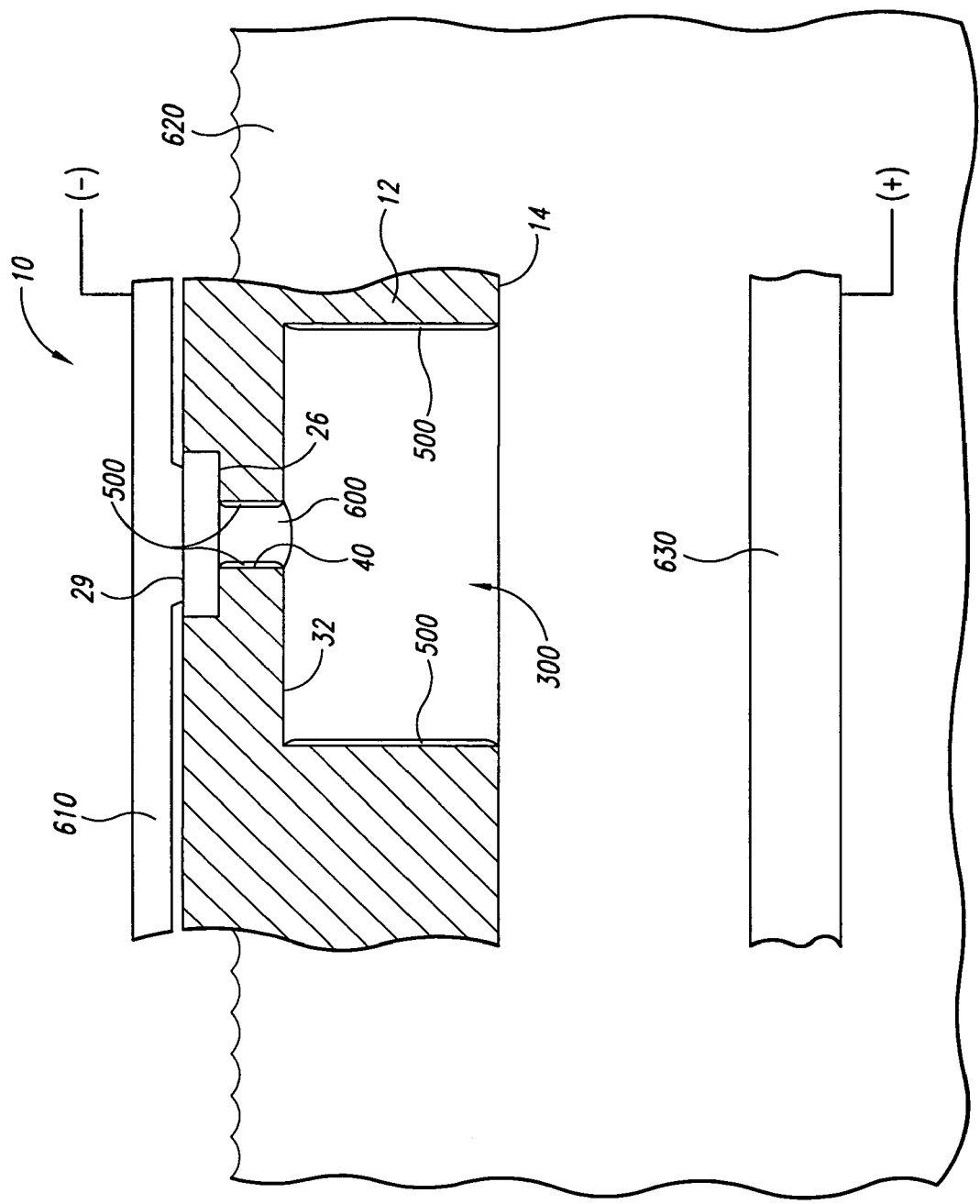
Figure 6C:
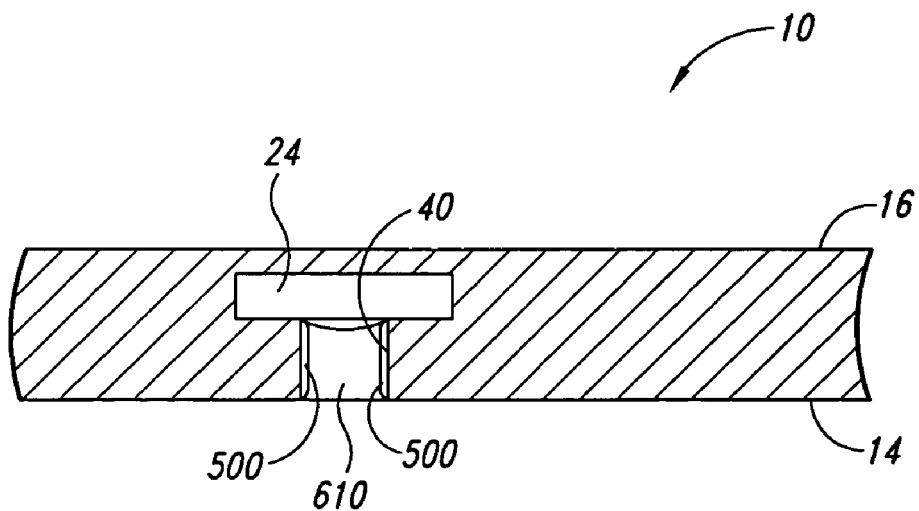

FIGS. 6A-6C illustrate another embodiment of the filling stage in which conductive material is plated into the second opening 40 to form an interconnect. FIG. 6A illustrates the workpiece 10 after lining the sidewall of the second opening 40 with the oxide 500 in a manner similar to the embodiment described above with reference to FIG. 5B. The embodiment shown in FIG. 6A further includes removing material from the second side 16 of the workpiece 10 to expose a bond-pad surface 29 of the conductive element 24. FIG. 6B illustrates the workpiece 10 in a bottom-up plating process that selectively fills the second opening 40 with a plug of conductive material 600. In this embodiment, a conductive member 610 engages the workpiece 10 such that the bond-pad surface 29 presses against the conductive member 610. This embodiment continues by placing the workpiece 10 in a plating solution 620 and applying an electrical potential to the electrical member 610 and an electrode 630. An electrical current accordingly passes through the conductive element 24 such that the ions in the plating solution 620 plate onto the contact surface 26 and progressively plate onto each other toward the end-surface 32. The plating process can be terminated when the second opening 40 is either fully or partially filled with the conductive material 600. FIG. 6C illustrates the workpiece 10 after it has been thinned to form an interconnect 610 in the second opening 40.

Figure 7A:
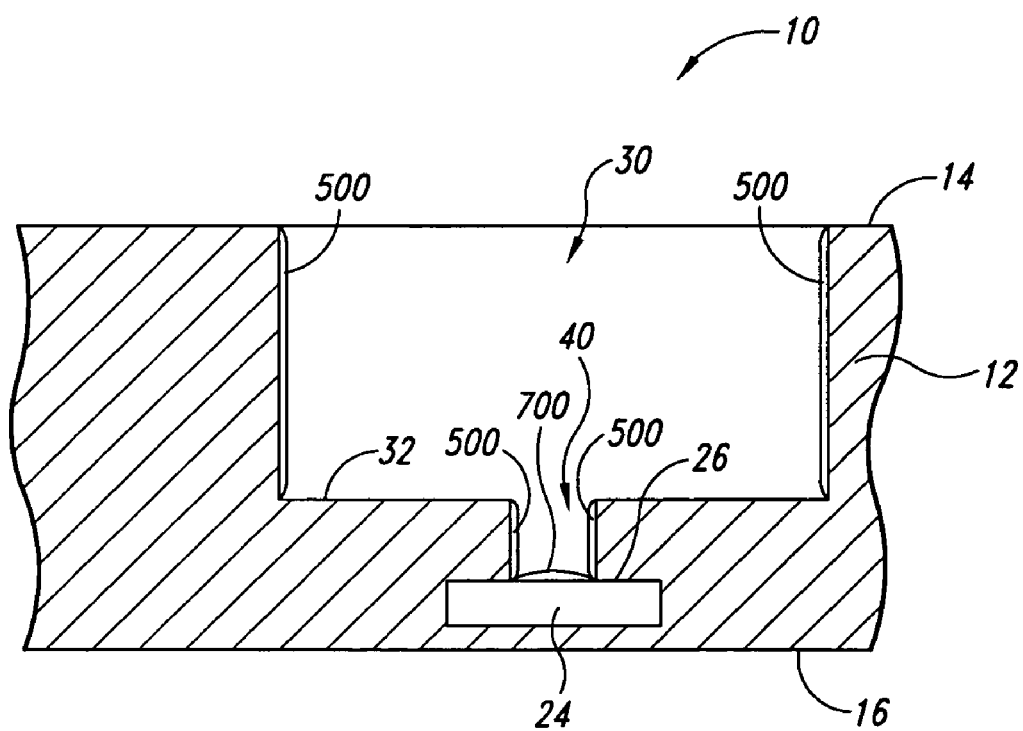
FIGS. 7A-7C are cross-sectional views of a portion of a workpiece illustrating stages of a method in accordance with another embodiment of the invention.
Figure 7B:
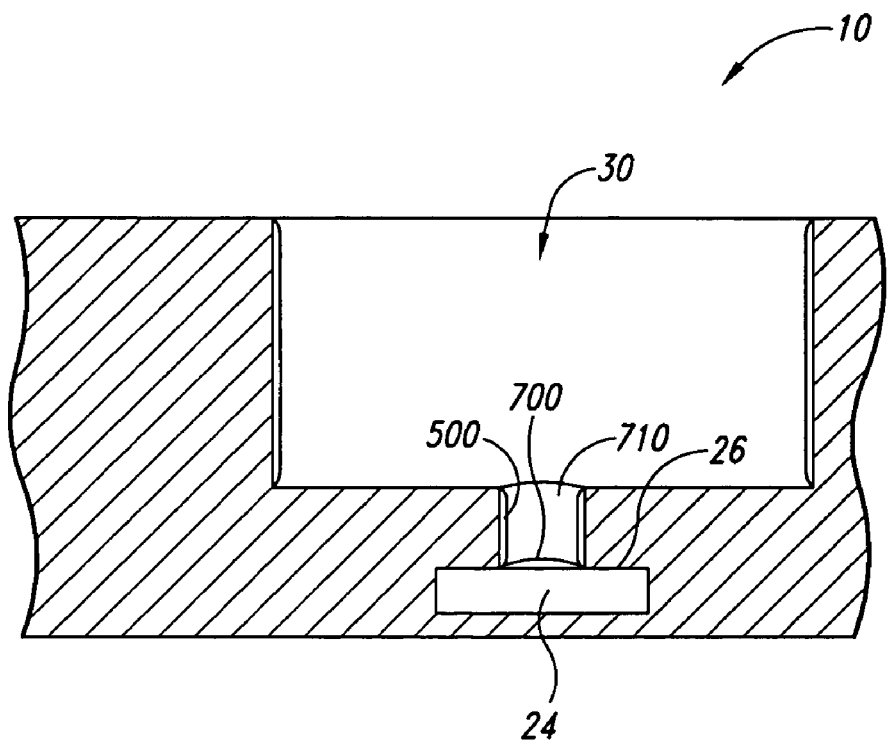
Figure 7C:
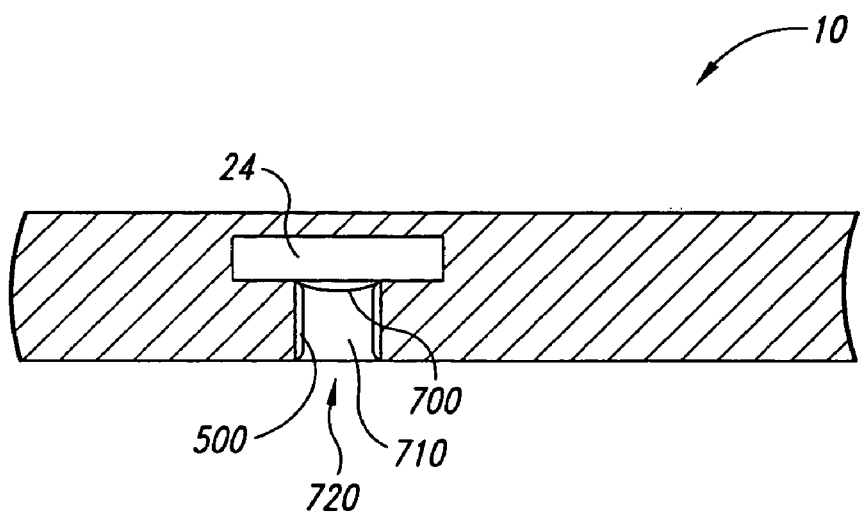

FIGS. 7A-7C illustrate still another embodiment of the filling stage for depositing a conductive material into the second opening 40. Referring to FIG. 7A, the contact surface 26 is cleaned using a wash to remove any oxide from the contact surface 26 and to form a thin layer 700 of conductive material on the contact surface 26. Referring to FIG. 7B, this embodiment continues by plating a conductive material 710 into the second opening 40 using an electroless plating process. In one embodiment, the electroless plating process can be a nickel "bottom-up" plating process that fills the remainder of the second opening 40 with nickel. In other embodiments, the electroless plating process can plate only a thin layer of nickel (e.g., five microns), and the remainder of the second opening 40 can be filled using a solder deposit to form plugs, posts or other structures in the second opening. FIG.

7C illustrates the workpiece 10 after it has been thinned to form an interconnect 720 defined by the layer 700 and the conductive material 710.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of forming an interconnect engaged with a blind contact surface of a conductive element of a microelectronic workpiece, the method comprising:
    forming a first opening in the workpiece, the first opening having a first width and extending from an exterior face of the workpiece to an intermediate depth within the workpiece;
    forming a second opening extending from the intermediate depth in the first opening to the contact surface, wherein the second opening has a second width less than the first width;
    filling the second opening with a conductive material; and
    removing material from the exterior face of the workpiece to form a surface at least at the intermediate depth of the first opening.

2. The method of claim 1 wherein forming the first opening comprises forming a cavity into the exterior face and forming the second opening comprises constructing a blind via.

3. The method of claim 2 wherein:
    forming the cavity comprises cutting a trench into the workpiece such that a portion of the trench is aligned with the conductive element;
    constructing the blind via comprises a two-phase etching procedure including a first phase in which a first etchant etches from the trench to an oxide on the contact surface and a second phase in which a second etchant etches from the oxide to the contact surface; and
    filling the second opening with a conductive material comprises plating the conductive material into the blind via.

4. The method of claim 2 wherein:
    forming the cavity comprises cutting a trench into the workpiece such that a portion of the trench is aligned with the conductive element;
    constructing the blind via comprises etching from the trench to the contact surface; and
    filling the second opening with a conductive material comprises plating the conductive material into the blind via using a bottom-up plating process.

5. The method of claim 2 wherein:
    forming the cavity comprises cutting a trench into the workpiece using a laser and/or an abrasive tool such that a portion of the trench is aligned with the conductive element;
    constructing the blind via comprises etching from the trench to the contact surface; and
    filling the second opening with a conductive material comprises plating the conductive material into the blind via.

6. The method of claim 2 wherein:
    forming the cavity comprises cutting a trench into the workpiece using a laser and/or an abrasive such that a portion of the trench is aligned with the conductive element;
    constructing the blind via comprises a two-phase etching procedure including a first phase in which a first etchant etches from the trench to an oxide on the contact surface and a second phase in which a second etchant etches from the oxide to the contact surface; and
    filling the second opening with a conductive material comprises plating the conductive material into the blind via using a bottom-up plating process.

7. The method of claim 2 wherein:
    forming the cavity comprises cutting a hole into the workpiece such that a portion of the hole is aligned with the conductive element;
    constructing the blind via comprises a two-phase etching procedure including a first phase in which a first etchant etches from the hole to an oxide on the contact surface and a second phase in which a second etchant etches from the oxide to the contact surface; and
    filling the second opening with a conductive material comprises plating the conductive material into the blind via.

8. The method of claim 2 wherein:
    forming the cavity comprises cutting a hole into the workpiece such that a portion of the hole is aligned with the conductive element;
    constructing the blind via comprises etching from the hole to the contact surface; and
    filling the second opening with a conductive material comprises plating the conductive material into the blind via using a bottom-up plating process.

9. The method of claim 2 wherein:
    forming the cavity comprises cutting a hole into the workpiece using a laser and/or an abrasive tool such that a portion of the hole is aligned with the conductive element;
    constructing the blind via comprises etching from the hole to the contact surface; and
    filling the second opening with a conductive material comprises plating the conductive material into the blind via.

10. The method of claim 2 wherein:
    forming the cavity comprises cutting a hole into the workpiece using a laser and/or an abrasive such that a portion of the hole is aligned with the conductive element;
    constructing the blind via comprises a two-phase etching procedure including a first phase in which a first etchant etches from the hole to an oxide on the contact surface and a second phase in which a second etchant etches from the oxide to the contact surface; and
    filling the second opening with a conductive material comprises plating the conductive material into the blind via using a bottom-up plating process.

* * * * *